(12) United States Patent
Abernathy et al.

(10) Patent No.: US 9,674,962 B2
(45) Date of Patent: Jun. 6, 2017

(54) METHODS FOR CONTINUOUSLY MOVING A FLUID DISPENSER WHILE DISPENSING AMOUNTS OF A FLUID MATERIAL

(71) Applicant: Nordson Corporation, Westlake, OH (US)

(72) Inventors: Ronald N. Abernathy, Vista, CA (US); Clifford A. Fowler, San Diego, CA (US); Philip P. Maiorca, Poway, CA (US); Horatio Quinones, San Marcos, CA (US); Thomas L. Ratledge, San Marcos, CA (US)

(73) Assignee: NORDSON CORPORATION, Westlake, OH (US)

( * ) Notice: Subject to any disclaimer, the term of this patent is extended or adjusted under 35 U.S.C. 154(b) by 0 days.

(21) Appl. No.: 14/280,032

(22) Filed: May 16, 2014

(65) Prior Publication Data

US 2014/0248421 A1 Sep. 4, 2014

Related U.S. Application Data

(63) Continuation of application No. 11/859,176, filed on Sep. 21, 2007, now Pat. No. 8,765,212.

(51) Int. Cl.
*C23C 16/52* (2006.01)
*H05K 3/00* (2006.01)
(Continued)

(52) U.S. Cl.
CPC ......... *H05K 3/0005* (2013.01); *H05K 3/0008* (2013.01); *H05K 13/0465* (2013.01);
(Continued)

(58) Field of Classification Search
CPC ............. H05K 13/0465; H05K 1/0269; H05K 2203/0126; H05K 2203/163; H05K 3/0005; H05K 3/0008
(Continued)

(56) References Cited

U.S. PATENT DOCUMENTS 4,376,584 A 3/1983 Hart et al.
4,773,025 A * 9/1988 Penkar et al. ............... 700/261
(Continued)

FOREIGN PATENT DOCUMENTS

CN 1575862 A 2/2005
JP 04037090 A 2/1992
(Continued)

OTHER PUBLICATIONS

The State Intellectual Property Office of the People's Republic of China, Search Report issued in related Chinese application No. 200810161710.7 dated Sep. 20, 2012.
(Continued)

*Primary Examiner* — Alexander Weddle
(74) *Attorney, Agent, or Firm* — Baker & Hostetler LLP

(57) ABSTRACT

Methods for applying fluid materials to a substrate, such as circuit board, while continuously moving the fluid dispenser. Some methods generally involve correcting the dispense location for each of the dispensed amounts of fluid material by executing a statistical comparison of either the predicted and actual landing locations on the substrate, or the predicted and actual positions of the dispenser at each of the dispense locations. Other methods generally involve initiating the dispensing of amounts of the fluid material at dispense locations corrected by a correction factor specified in terms of the servo cycle for the movement of the dispenser or by a correction factor specified in terms of partial servo cycles courtesy of a timer.

12 Claims, 4 Drawing Sheets

(51) Int. Cl.
*H05K 13/04* (2006.01)
*H05K 1/02* (2006.01)

(52) U.S. Cl.
CPC ... *H05K 1/0269* (2013.01); *H05K 2203/0126* (2013.01); *H05K 2203/163* (2013.01)

(58) Field of Classification Search
USPC ............ 222/52, 63, 71; 427/8, 427.2, 427.3; 347/8, 19
See application file for complete search history.

(56) References Cited

U.S. PATENT DOCUMENTS

| | | | |
|---|---|---|---|
| 4,967,933 | A | 11/1990 | Maiorca et al. |
| 5,052,338 | A | 10/1991 | Maiorca et al. |
| 5,320,250 | A | 6/1994 | La et al. |
| 5,434,489 | A | 7/1995 | Cheng et al. |
| 5,505,777 | A | 4/1996 | Ciardella et al. |
| 5,711,989 | A | 1/1998 | Ciardella et al. |
| 5,747,102 | A | 5/1998 | Smith et al. |
| 5,810,988 | A | 9/1998 | Smith, Jr. et al. |
| 6,173,864 | B1 | 1/2001 | Reighard et al. |
| 6,253,957 | B1 | 7/2001 | Messerly et al. |
| 6,714,201 | B1 | 3/2004 | Grinstein et al. |
| 6,922,606 | B1 | 7/2005 | Yutkowitz |
| 2005/0001869 | A1* | 1/2005 | Abernathy et al. ............. 347/17 |
| 2005/0122363 | A1 | 6/2005 | Koyama |
| 2005/0248605 | A1* | 11/2005 | Pinard et al. .................... 347/19 |
| 2006/0221104 | A1 | 10/2006 | Iwata et al. |

FOREIGN PATENT DOCUMENTS

| | | |
|---|---|---|
| JP | 05090799 A | 4/1993 |
| JP | 2004020966 A | 1/2004 |
| JP | 2004344883 A | 12/2004 |
| TW | I254789 B | 5/2006 |
| TW | 200732051 | 9/2007 |
| TW | I286951 B | 9/2007 |

OTHER PUBLICATIONS

Japanese Patent Office, Office Action issued in related Japanese patent application No. 2008-242419 dated Sep. 5, 2012.
Intellectual Property Office, Official Action issued in Taiwan application No. 097133299 dated Jan. 14, 2014.
AM Weddle, Office Action issued in U.S. Appl. No. 11/859,176 dated Jul. 15, 2013.
AM Weddle, Office Action issued in U.S. Appl. No. 11/859,176 dated Mar. 1, 2013.
AM Weddle, Office Action issued in U.S. Appl. No. 11/859,176 dated Aug. 21, 2012.
AM Weddle, Office Action issued in U.S. Appl. No. 11/859,176 dated Feb. 2, 2011.
AM Weddle, Office Action issued in U.S. Appl. No. 11/859,176 dated Aug. 9, 2010.
AM Weddle, Notice of Allowance issued in U.S. Appl. No. 11/859,176 dated Mar. 6, 2014.
Korean Patent Office, Notice of Preliminary Rejection in Korean Application No. 10-2008-0090907, Feb. 27, 2015.

* cited by examiner

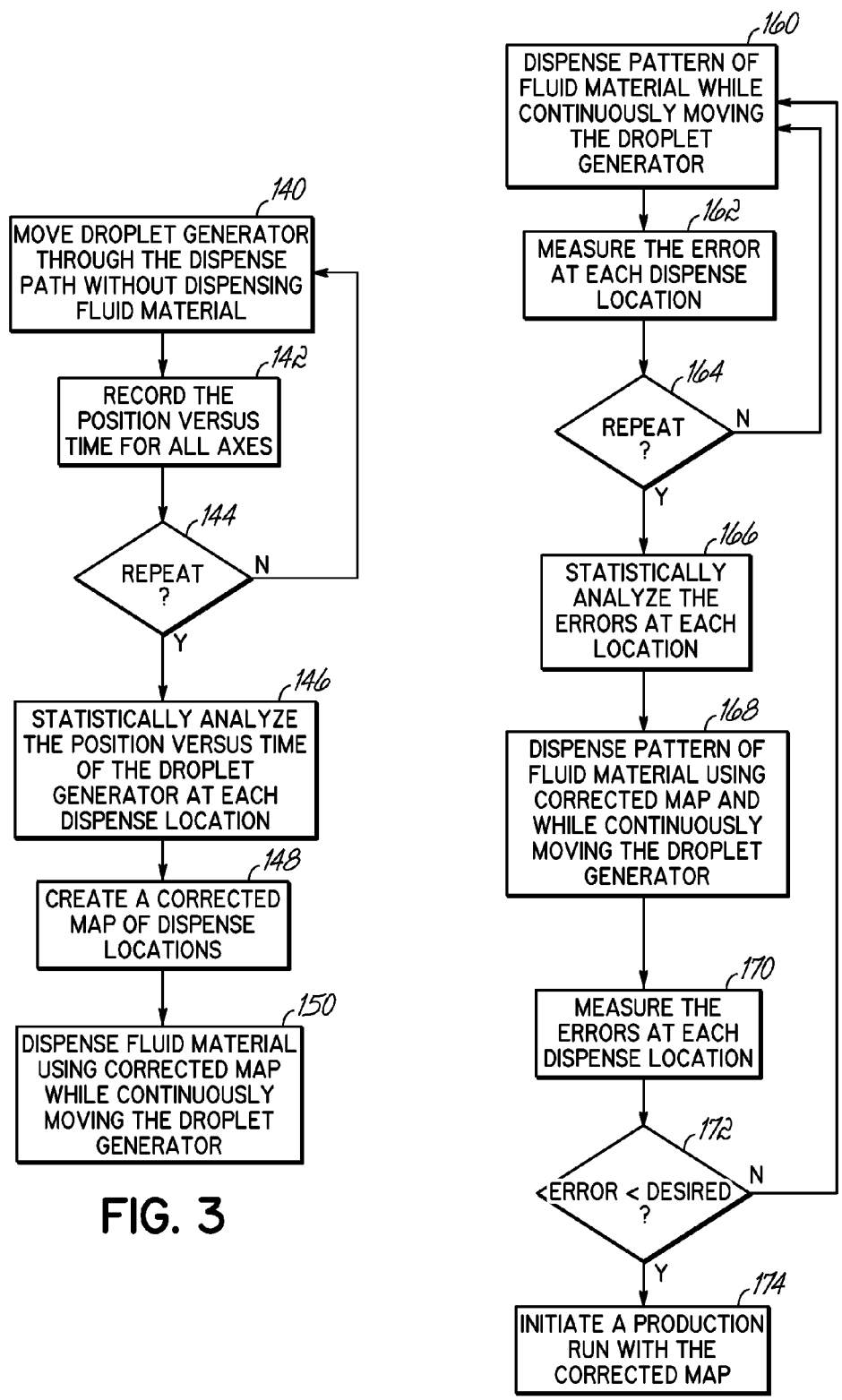

METHODS FOR CONTINUOUSLY MOVING A FLUID DISPENSER WHILE DISPENSING AMOUNTS OF A FLUID MATERIAL

FIELD OF THE INVENTION

The invention relates generally to methods for dispensing fluid materials and, more particularly, to methods for dispensing a fluid material, such as an underfill material, from a fluid dispenser onto a circuit board or other type of substrate.

BACKGROUND OF THE INVENTION

Mechanically-actuated "jetting" dispensers are commonly used in the electronics industry, to selectively dispense minute amounts or droplets of a highly viscous fluid material in a non-contact manner onto a circuit board. A typical jetting system includes an applicator or jetting dispenser with a pneumatically-operated needle having a valve element at one end that is configured to selectively engage a valve seat surrounding a discharge passage. Contact between the valve element and valve seat seals off the discharge passage from a chamber supplied with pressurized fluid material. To dispense droplets of the fluid material, the valve element is retracted from contact with the valve seat. A small amount of the fluid material is permitted to flow past the valve seat and into the discharge passage. The valve element is then moved rapidly toward the valve seat to close the space. The rapid reduction in volume extrudes the fluid material through the discharge passage and a shock wave traveling through the fluid and/or the momentum imparted by the extrusion process causes a droplet of the fluid material to be ejected, or "jetted," from an outlet of the discharge passage. The droplet, which contains a small discrete volume of the fluid material, travels with a ballistic trajectory and eventually lands at a specified location on the circuit board.

Jetting dispensers are able to "fly" above the circuit board at a fixed height and "jet" the material onto an intended application area in a non-contact manner. By rapidly jetting the material "on the fly" (i.e., while the jetting dispenser is in motion), the dispensed droplets may be joined to form a continuous line. Consequently, jetting dispensers may be easily programmed to dispense desired patterns of fluid material. This versatility has made jetting dispensers suitable for a wide variety of applications in the electronics industry.

The jetting dispenser for applying such fluid materials is typically moved by a robot in a pattern across a surface of the circuit board that bears the components. However, the motion is not continuous. When the motion relative to the circuit board places the jetting dispenser at an appropriate dispensing location, the fluid material is dispensed from the jetting dispenser onto the corresponding area or component of the circuit board. The robot then moves the jetting dispenser to the next area or component destined to receive fluid material and, subsequently, dispenses another amount of fluid material.

Each time that fluid material is dispensed, the robot must accelerate the jetting dispenser to move between areas or components on the circuit board. Similarly, the robot must decelerate when slowing the motion of the jetting dispenser in advance of dispensing an amount of fluid material. For example, underfill materials are commonly dispensed in a successive continuous events to define short line segments. In that specific application, the stop and start between consecutive line segments lengthens the dispensing time and, furthermore, causes vibration in the jetting dispenser.

Therefore, improved methods of applying fluid materials are needed that are capable of more accurately dispensing amounts of fluid material from a continuously moving jetting dispenser onto a circuit board.

SUMMARY OF THE INVENTION

In one embodiment, a method of operating a dispenser to dispense amounts of a fluid material at a plurality of dispense locations includes continuously moving the dispenser through a constant motion trajectory connecting the dispense locations while measuring an actual position of the dispenser at each of the dispense locations. Each of the actual positions is compared with a respective one of the dispense locations to generate a spatial error. Based upon the comparison, at least one of the dispense locations is corrected to reduce the respective spatial error.

In another embodiment, a method of operating a dispenser to dispense amounts of a fluid material at a plurality of dispense locations includes continuously moving the dispenser through a constant motion trajectory connecting the dispense locations while triggering the dispenser at each of the dispense locations to dispense one of the amounts of the fluid material. The amounts of the fluid material dispensed from the dispenser are deposited on a substrate and spatial coordinates of a landing location on the substrate are measured for each of the deposited amounts of the fluid material. The spatial coordinates of each landing location are compared with spatial coordinates for a respective expected landing location on the substrate to generate a spatial error. Based upon the comparison, at least one of the dispense locations is corrected to reduce the spatial error.

In another embodiment, a method is provided for operating a dispenser to dispense amounts of a fluid material at a plurality of dispense locations connected by a constant motion trajectory. The method comprises continuously moving the dispenser under servo control through the constant motion trajectory and changing a direction of the continuous movement of the dispenser at an updating rate given by a servo cycle. A control signal is communicated to the dispenser to initiate the dispensing of each of the amounts when the dispenser is at a given number of servo cycles in advance of reaching the respective one of the dispense locations. Alternatively, a timer may be used to improve upon the native timing of the servo cycle. The trigger for initiating dispensing is knowledge of the time when the dispenser is positioned over each desired dispense location in servo cycles. The amounts of the fluid material dispensed from the dispenser are deposited on a substrate.

BRIEF DESCRIPTION OF THE DRAWING

The accompanying drawings, which are incorporated in and constitute a part of this specification, illustrate exemplary embodiments of the invention and, together with a general description of embodiments of the invention given above, and the detailed description given below, serve to explain the principles of the embodiments of the invention.

FIG. 3 is a flow chart generally displaying an embodiment of a procedure for controlling the operation of the fluid material jetting system of FIGS. 1 and 2;

FIG. 4 is a flow chart generally displaying another embodiment of a procedure for controlling the operation of the fluid material jetting system of FIGS. 1 and 2.

DETAILED DESCRIPTION

Figure 1:
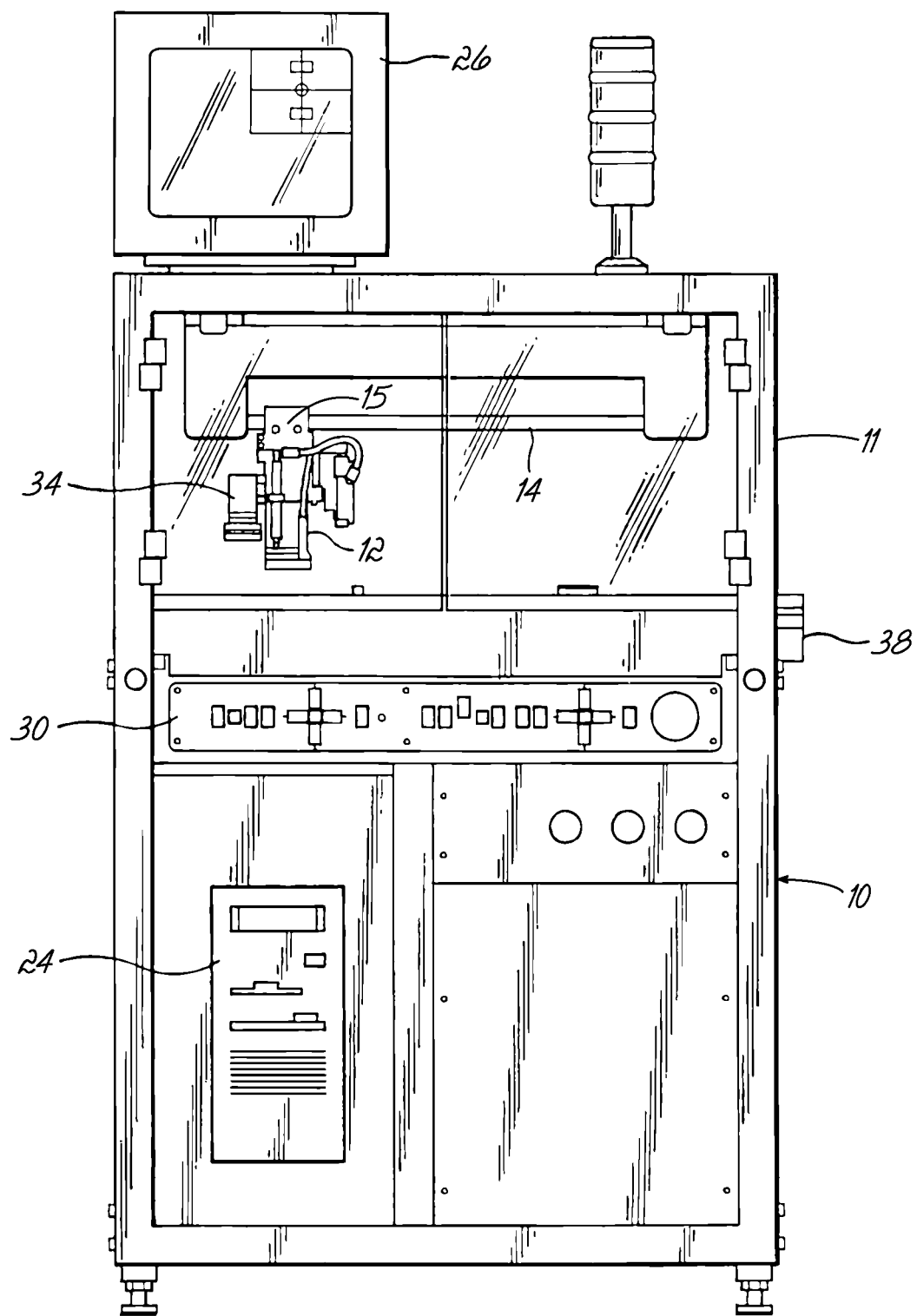
FIG. 1 is a schematic representation of a fluid material jetting system in accordance with an embodiment of the present invention.
Figure 2:
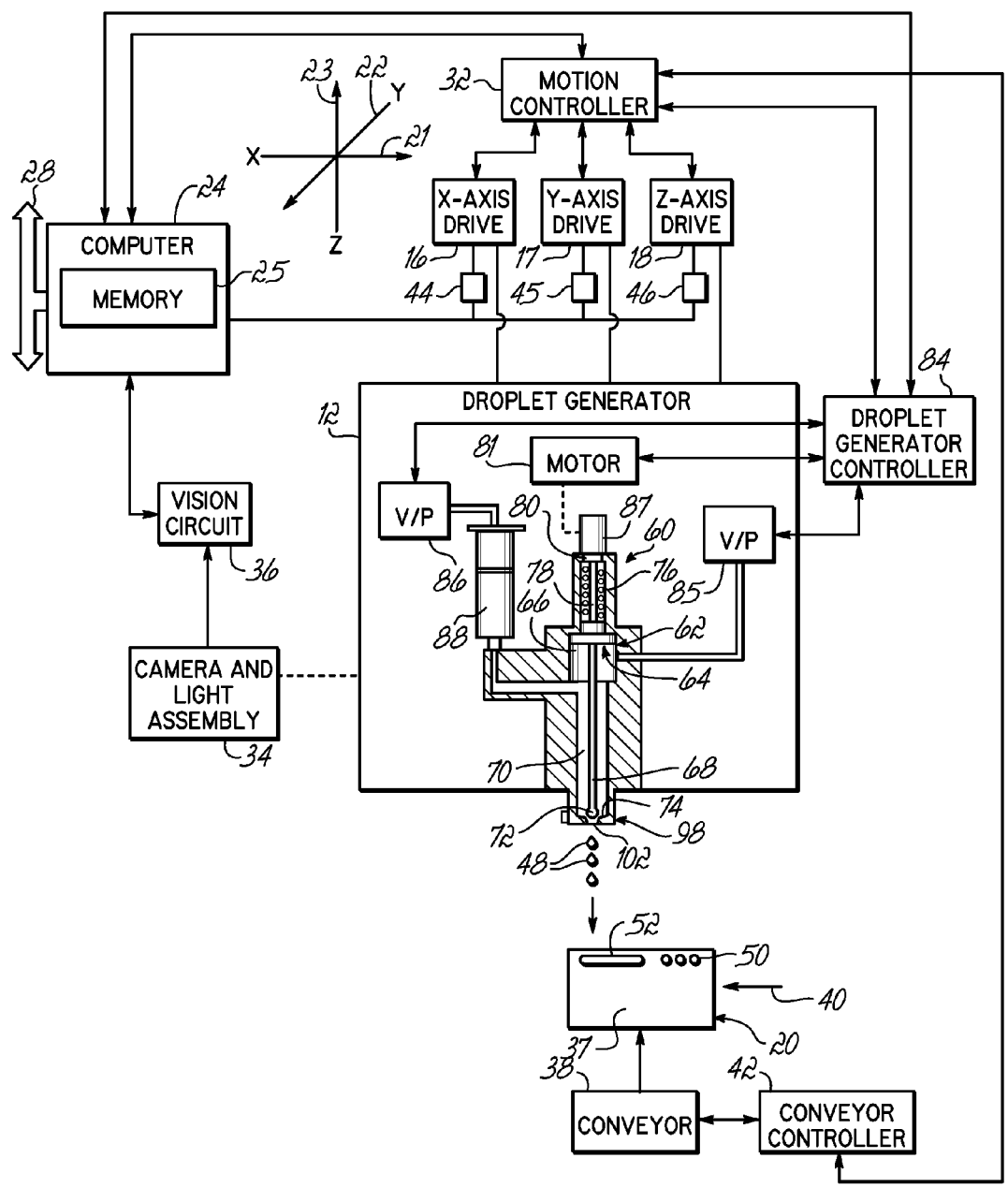
FIG. 2 is a schematic block diagram of the fluid material jetting system of FIG. 1.

With reference to FIGS. 1 and 2, a fluid material jetting system 10 includes a cabinet 11 consisting of a framework of interconnected horizontal and vertical beams partially covered by panels. The jetting system 10 includes a fluid material droplet generator 12 for dispensing amounts 48 of a fluid material, for example, an adhesive, epoxy, solder, etc. The fluid material droplet generator 12 is mounted on a Z-axis drive mechanism 15 and suspended from an X-Y positioner 14 supported by the cabinet 11. The X-Y positioner 14 is operated by a pair of independently controllable axis drives 16, 17. Similarly, the z-axis drive mechanism 15 is operated by an axis drive 18. The X-Y positioner 14 and Z-axis drive mechanism 15 provide three substantially perpendicular motion axes for the droplet generator 12.

Axis drives 16, 17, 18 are capable of rapidly moving the droplet generator 12 over the surface of a substrate 20, such as a printed circuit board, relative to the multiple motion axes 21, 22, 23 in a three-dimensional Cartesian coordinate frame with high precision coordinated position servo control orchestrated by a computer 24. The axis drives 16, 17, 18 include the electro-mechanical components of the X-Y positioner 14 and the Z-axis drive mechanism 15, such as the motors and drive circuitry, to provide motion relative to the X, Y and Z motion axes 21, 22, 23, respectively. Although the droplet generator 12 may be raised and lowered using the Z-axis drive mechanism 15 to dispense fluid material from other various heights above the substrate 20 or to clear components mounted on the substrate 20, the droplet generator 12 normally ejects or jets droplets of fluid material from a single fixed height.

The computer 24, which is mounted in the cabinet 11, provides the overall control for the jetting system 10 that coordinates the movements and actuations. The computer 24 may be a programmable logic controller (PLC), a digital signal processor (DSP), or another microprocessor-based controller with a central processing unit capable of executing software stored in a memory 25 and carrying out the functions described herein, as will be understood by those of ordinary skill. A human machine interface (HMI) device 26 is operatively connected to the computer 24 in a known manner. The HMI device 26 may include output devices, such as alphanumeric displays, a touch screen, and other visual indicators, and input devices and controls, such as an alphanumeric keyboard, a pointing device, keypads, pushbuttons, control knobs, etc., capable of accepting commands or input from the operator and transmitting the entered input to the central processing unit of computer 24. The computer 24 may be provided with standard communications busses 28 compatible with other automated equipment utilized in substrate production assembly lines. A control panel 30, which may be supported by the cabinet 11, includes push buttons for manual initiation of certain functions, for example, during set-up, calibration, and fluid material loading.

A motion controller 32, which is electrically coupled with the computer 24 and with the axis drives 16, controls the three-dimensional movement of the droplet generator 12 and an accompanying video camera and light assembly 34. The motion controller 32 is in electrical communication with each of the axis drives 16, 17, 18 and provides command signals, under the instruction of computer 24, to separate drive circuits of the individual axis drives 16, 17, 18 in a known manner. The computer 24 typically instructs the motion controller 32 to move the axis drives 16, 17, 18 in a scripted manner that is repeated for a series of substrates 20.

The video camera and light assembly 34 moves with the droplet generator 12 to inspect dots 50 and locate reference fiducial points on substrate 20. The video camera and light assembly 34 may be of the type described in U.S. Pat. No. 5,052,338, the disclosure of which is hereby incorporated by reference herein in its entirety. The camera and light assembly 34 is electrically coupled with a vision circuit 36, which powers the light for illuminating an upper surface 37 of the substrate 20. The vision circuit 36 also receives and transfers images from the video camera in the assembly 34, which may be a charge coupled device (CCD), to the computer 24 for use during jetting operations.

Substrates 20, which are intended to receive jetted amounts 48 of fluid material, are transported directly beneath the droplet generator 12 by a conveyor 38. The conveyor 38, which is of conventional design, has a width that can be adjusted to accept substrates 20 of different dimensions. The conveyor 38 may also include pneumatically operated lift and lock mechanisms (not shown). The conveyor 38 serially moves each substrate 20 in a batch of substrates 20 to a desired position near the droplet generator 12, as indicated by the horizontal single-headed arrow 40 in FIG. 2.

With continued reference to FIGS. 1 and 2, a conveyor controller 42 is electrically connected with the substrate conveyor 38. The conveyor controller 42 provides an interface between the motion controller 32 and the conveyor 38, under the instruction of computer 24, for controlling the width adjustment and lift and lock mechanisms of the conveyor 38. Alternatively, the computer 24 may be connected directly with the conveyor controller 42 without routing the control signals through the motion controller 32. The conveyor controller 42 also controls the transfer of the substrates 20 through the jetting system 10 before and after the fluid material application process.

Each of the axis drives 16, 17, 18 includes an encoder 44, 45, 46, respectively, that is used for closed-loop feedback control. The encoders 44, 45, 46 generate signals that reflect operation of the respective one of the axis drives 16, 17, 18, which in turn represents changes in the position of the droplet generator 12 relative to the substrate 20.

The droplet generator 12 jets droplets or amounts 48 of fluid material from a jetting dispenser 60 downwardly toward the upper surface 37 of the substrate 20. The fluid material amounts 48, which impact the upper surface 37, are applied upon impact on the substrate 20 as fluid material dots 50. The substrate 20 may be of the type carrying surface-mounted components, which necessitates jetting the minute fluid material amounts 48 rapidly and with accurate placement to form fluid material dots 50 at targeted locations on the substrate 20. The droplet generator 12 may be operated such that a succession of jetted amounts 48 form a segment or line 52 of fluid material or a line of dots 50 on the upper surface 37 of substrate 20. As used herein, the term "jetting" refers to a process for forming fluid material amounts 48 and for forming the dots 50 (or lines 52). The jetting dispenser 60 is capable of jetting amounts 48 of fluid material from an opening or outlet orifice 102 in a nozzle 98 at very high rates, for example, more than 100, or more, minute amounts per second.

The jetting dispenser 60 is a non-contact dispenser specifically designed for jetting minute amounts 48 of fluid material. The jetting dispenser 60 includes an actuator or needle valve 62 including an air piston 64 disposed in an air cylinder 66 and a lower rod or shaft 68 extending from the air piston 64 into a chamber 70. A lower end 72 of the shaft 68 is biased into contact with a valve seat 74 by a return spring 76. When in a contacting relationship, the lower end 72 is geometrically shaped to provide a seal with the valve seat 74. Thus, the needle valve 62 is closed by the lower end 72 contacting and bearing against the valve seat 74, and the needle valve 62 is opened by moving the lower end 72 away from the valve seat 74, thereby permitting a downstream flow of fluid material through a gap between the lower end 72 and the needle seat 62.

Extending upwardly from the air piston 64 is an upper rod 78 having a distal upper end disposed adjacent a stop surface define on the end of a screw 80 of a micrometer 87. Adjusting the micrometer screw 80 changes the upper limit of the stroke of the air piston 64 and, therefore, the stroke length of the shaft 68. The stroke length determines the final velocity of the needle valve 62 before the lower end 72 strikes the valve seat 74. Generally, the size of the dots 50 increases with increasing stroke length. Generally, longer stroke lengths generate higher ejection velocities for the jetted amounts 48 of fluid material. A motor 81, which is controlled by instructions from a droplet generator controller 84, may be mechanically coupled to the micrometer screw 80. Consequently, the droplet generator controller 84 may automatically adjust the stroke of the air piston 64, which varies the volume of fluid material in each jetted amount 48. Jetting dispensers similar to those described above are more fully described in U.S. Pat. Nos. 6,253,957 and 5,747,102, the entire disclosures of which are hereby incorporated herein by reference. Because the droplet generator 12 may be implemented using different designs, the specific embodiments described herein are to be considered exemplary, and not limiting, of the present invention.

The droplet generator controller 84 is electrically coupled with a voltage-to-pressure transducer 85, for example, an air piloted fluid regulator, one or more pneumatic solenoids, etc., connected to a pressurized fluid source (not shown). The droplet generator controller 84 is configured to provide an output pulse to voltage-to-pressure transducer 85, which responds by porting a pulse of pressurized air into the air cylinder 66 and produces a rapid lifting of the air piston 64 that lifts the lower end 72 of the shaft 68 away from valve seat 74 and further compresses the return spring 76. Lifting the lower end 72 from the valve seat 74 draws fluid material from chamber 70 into a space between the valve seat 74 and the outlet orifice 102 in nozzle 98.

With continued reference to FIGS. 1 and 2, the droplet generator controller 84 is also electrically coupled with a voltage-to-pressure transducer 86, for example, an air piloted fluid regulator, one or more pneumatic solenoids, etc. The voltage-to-pressure transducer 86 is connected to a pressurized source of fluid (not shown), that in turn ports pressurized air to a supply reservoir 88, which holds a supply of the fluid material. The supply reservoir 88, which may have the form of a filled syringe cartridge, communicates with the chamber 70 for continuously receiving volumes of the fluid material as required by the dispensing operation. Thus, the supply reservoir 88 supplies pressurized fluid material to the chamber 70 for use in jetting the amounts 48.

With reference to FIG. 3, a routine for operating the jetting system 10 is shown for dispensing a pattern of fluid material dots 50 on substrate 20 while the droplet generator 12 is continuously moved without stopping relative to the substrate 20. The pattern of fluid material on the substrate 20 is generated from a map of dispense locations in a reference frame defined by the X, Y, and Z motion axes 21, 22, 23. Each of the dispense locations may be located in a plane substantially parallel to a planar surface of a substrate 20 receiving the fluid material amounts 48. At each individual dispense location contained in the map, the computer 24 instructs the droplet generator controller 84 to cause the droplet generator 12 to eject one of the fluid material amounts 48 from the jetting dispenser 60.

In block 140 and as part of the routine of FIG. 3, the jetting system 10 is operated to move the droplet generator 12 through a constant motion trajectory or dispense path containing the dispense locations, but without dispensing fluid material. To that end, the computer 24 provides command signals to the motion controller 32 directing controller 32 to continuously move the droplet generator 12 through each dispense location in the map of dispense locations. This results in the jetting dispenser 60 being moved by the axis drives 16, 17, 18 with smooth changes in direction through the map of dispense locations. The dispense path for all dispense locations may be optimized for minimizing the total travel distance for the droplet generator 12 to move to dispense the fluid material amounts 48 at all of the dispense locations in the map.

In block 142, the actual position of the droplet generator 12 is recorded as a function of time along each of the three motion axes 21, 22, 23 as the droplet generator 12 is continuously moved without significant acceleration or deceleration. To that end, the computer 24 monitors the electrical output signals generated by, and communicated from, one or more of the encoders 44, 45, 46 as the droplet generator 12 is continuously moved through the dispense path. These output signals are representative of the location in three dimensions of the droplet generator 12 as a function of time. These encoder readings are correlated with each dispense location to generate one of the actual positions. At each dispense location, the computer 24 records the encoder signals and correlates the recorded encoder signals, which represent the actual location of the droplet generator 12 relative to the substrate 20, with that dispense location.

In block 144, the procedures of blocks 140, 142 are iterated for a statistically significant number of times (e.g., 100 iterations). At the conclusion of these iterations, control is transferred to block 146 in which the computer 24 evaluates the encoder signals representing the recorded position at each dispense location in the map. Specifically, the computer 24 statistically analyzes the actual spatial position of the droplet generator 12 at each dispense location for the multiple iterations. In block 148, based upon the statistical analysis, the computer 24 creates a corrected map of corrected or optimized dispense locations in which at least one of the dispense locations is corrected to reduce the corresponding spatial error. The statistical analysis optimally corrects for path following errors. Path following errors tend to be repeatable, which permits the implementation of statistical mathematics to improve dispensing accuracy.

In block 150, the computer 24 causes the conveyor 38 to transport one of the substrates 20 to a fixed position within the jetting system 10 by issuing commands to the conveyor controller 42. In a known manner, the video camera of the video camera and light assembly 34 communicates one or more images of the substrate 20 through the vision circuit 36 to the computer 24. The computer 24 locates fiducial marks on the substrate 20 visible in the image(s) and corrects for any substrate misalignment. The computer 24 causes the droplet generator controller 84 to operate the droplet generator 12 for dispensing the fluid material amounts 48 onto the substrate 20. The fluid material amounts 48 are dispensed while the droplet generator 12 is continuously moved without stopping relative to the substrate 20. The dispense location at which the droplet generator controller 84 is triggered by a command signal communicated from computer 24 to dispense each amount 48 is determined by the corrected map of dispense locations generated in block 148. The fluid material amounts 48 from the jetting dispenser 60 impact the upper surface 37 of substrate 20 and are applied on contact as one of the fluid material dots 50.

The routine of FIG. 3 may be repeated to dispense fluid material amounts 48 using the corrected map of dispense locations onto additional substrates 20 conveyed into the jetting system 10 as part of a production run processing a batch of substrates 20. For each substrate 20 in the product run, the fluid material amounts 48 are dispensed while the droplet generator 12 is continuously moved relative to the substrate 20 without stopping (i.e., without any accelerations or decelerations). The dispense locations at which the droplet generator controller 84 is triggered to dispense the fluid material amounts 48 is determined by the corrected map of dispense locations generated in block 148.

With reference to FIG. 4 and in accordance with an alternative embodiment, the actual spatial location of each of the fluid material dots 50 on the substrate 20 is compared with a predicted spatial location to generate a corrected map of dispense locations.

In block 160, the computer 24 commands the conveyor controller 42 to operate the conveyor 38 and transport one of the substrates 20 to a fixed position within the jetting system 10. In a known manner, the video camera of the video camera and light assembly 34 communicates one or more images of the substrate 20 through the vision circuit 36 to the computer 24. The computer 24 locates fiducial marks on the substrate 20 visible in the image(s) and corrects for any substrate misalignment. Thereafter, the computer 24 causes the droplet generator controller 84 to operate the droplet generator 12 for dispensing each of the amounts 48 that land on the substrate 20 as fluid material dots 50.

In block 162, the computer 24 measures spatial coordinates for the landing location of each fluid material dot 50 on the substrate 20 by analyzing an image acquired with the video camera of the camera and light assembly 34 and vision circuit 36. The computer 24 compares the measured landing location for each fluid material dot 50 in the image with a reference or predicted landing location defined in the pre-programmed pattern. Based upon the comparison, the computer 24 generates a spatial error in the X-Y plane containing the X, y motion axes 21, 22, for each dispense location in the map that generated the pattern of fluid material dots 50 on the substrate 20.

In block 164, the procedures of blocks 160, 162 are iterated for a statistically significant number of times (e.g., 100 iterations). Each iteration entails transport another substrate 20 to the fixed position within the jetting system 10, using the video camera of the video camera and light assembly 34 to identify fiducial marks on the substrate 20, correcting for any substrate misalignment, dispensing the amounts 48 of fluid material from the jetting dispenser 60 onto the substrate 20, measuring the landing position of the fluid material dots 50 on the substrate 20 in an image acquired with the video camera of the video camera and light assembly 34, and comparing the measured landing locations and the predicted landing locations in the pattern to generate a spatial error for each landing location. The analysis of the image is accomplished using standard image analysis techniques understood by a person having ordinary skill in the art. At the conclusion of these iterations, control is transferred to block 166.

In block 166, the computer 24 statistically analyzes the spatial error for each fluid material dot 50 in the pattern and for the number of substrates 20 in the iterated procedure. The spatial error associated with each dispense location includes servo position following errors, as well as abbe errors (i.e., errors outside of the servo loop). Both servo loop errors and abbe errors tend to be very repeatable. The repeatability of the servo loop errors and the abbe errors permits the jetting system 10 to correct the accuracy of the final dispense locations in the pattern by using statistical techniques. The spatial errors are used to correct the dispense locations in the map such that the spatial error for each landing location is reduced.

In block 168, the computer 24 causes the conveyor 38 to transport another substrate 20 to the fixed position within the jetting system 10, uses the video camera of the video camera and light assembly 34 to identify fiducial marks on the substrate 20, corrects for any substrate misalignment, and causes the droplet generator controller 84 to operate the droplet generator 12 to dispense the amounts 48 of fluid material from the continuously moving jetting dispenser 60 onto the substrate 20. The map of dispense locations is corrected for spatial errors calculated in block 166. In block 170, the computer 24 measures the landing position of each fluid material dot 50 on the substrate 20 in an image taken by the video camera of the video camera and light assembly 34 and compares the actual measured landing locations and the predicted landing locations in the pattern to generate spatial errors.

In block 172, the computer 24 compares the spatial errors with a reference, which may represent the maximum permissible errors. If the spatial errors are not within process tolerance, control is returned to block 160 for a re-calibration to generate a corrected map of dispense locations that reduce the spatial errors to within process tolerance. If the spatial errors are within process tolerance, control is transferred to block 174 to apply the pre-programmed pattern of amounts 48 with the corrected map to a series of substrates 20 in a production run.

Figure 5:
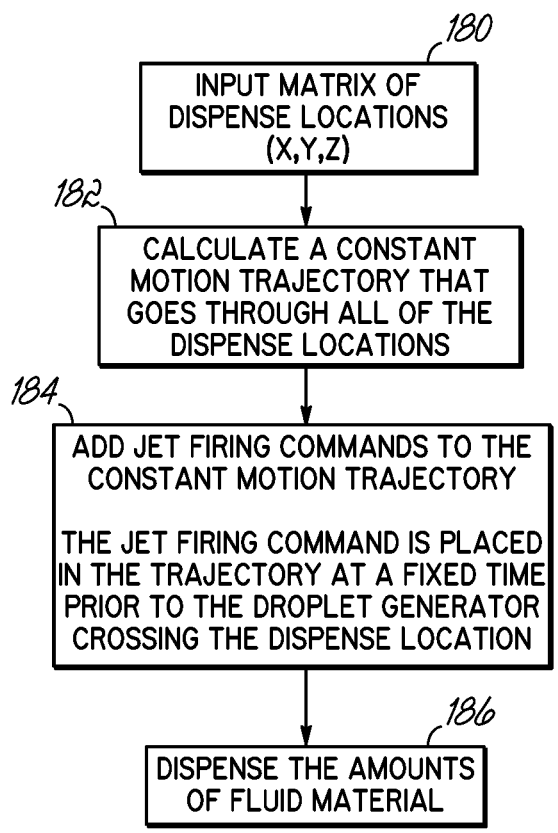
FIG. 5 is a flow chart generally displaying yet another embodiment of a procedure for controlling the operation of the fluid material jetting system of FIGS. 1 and 2.

With reference to FIG. 5 and in accordance with an embodiment, a method for continuously moving the droplet generator 12 relative to the substrate 20 includes using a spline technique, or similar mathematical method, to connect or string a series of discrete dispense locations into one continuous path. Each dispense location represents a location for queuing or triggering a dispensing event that ultimately ejects one of the amounts 48 from the droplet generator 12. The triggering location compensates for the continuous motion of the droplet generator 12 as the droplet generator 12 is not stationary when each of the amounts 48 of fluid material is dispensed.

In block 180, a pre-programmed pattern of dispense locations within the X, Y and Z motion axes 21, 22, 23 is input into a trajectory generator executing on the computer 24. Each of the dispense locations is defined by a set of spatial coordinates relative to the X, Y and Z motion axes 21, 22, 23. In block 182, the trajectory generator executing on the computer 24 determines a dispense path or constant motion trajectory that guarantees the droplet generator 12 moves through each dispense location.

Various different mathematical algorithms may be employed to create and optimize the constant motion trajectory. Typically, the optimization is targeted at reducing the total motion of the droplet generator 12 while optimizing placement accuracy of the fluid material dots 50 on substrate 20. In one embodiment, the algorithm involves a cubic spline technique that defines a constant motion trajectory with curves that define smooth transitions for directional changes of the droplet generator 12 along the X, Y and Z motion axes 21, 22, 23. As understood by a person having ordinary skill in the art, a spline is a piecewise polynomial (parametric) curve and, in particular, a cubic spline is a spline constructed of piecewise third-order polynomials which pass through a set of control points, such as the dispense locations for the amounts 48 of fluid material.

In block 184, the constant motion trajectory is modified by incorporating triggering commands to fire the jetting dispenser 60 on a time dependent basis. The constant motion trajectory contains time interval and location information for every cycle of the axis drives 16, 17, 18. Because the latency of the jetting dispenser 60 (i.e., the time between triggering the jetting dispenser 60 to dispense one of the amounts 48 and actually ejecting the amount 48 of fluid material) is known in time, jet firing or triggering commands are inserted into the constant motion trajectory for movement between the dispense locations in the pattern by subtracting a time interval (proportional to the cycle of the axis drives 16, 17, 18) from each desired dispense location.

The axis drives 16, 17, 18 may have the construction of servo or stepper motors so that the axis drives 16, 17, 18 are controlled by the computer 24 and motion controller 32 under servo control in a servo loop, which is the closed-loop control of position and velocity. The servo cycle time represents the amount of time needed for measuring the axis positions and issuing a new direction command. The computer 24 and/or motion controller 32 sample the stream of feedback information containing the time-dependent location of the axis drives 16, 17, 18 provided by the encoders 44, 45, 46. The computer 24 and/or motion controller 32 supply a direction command in the form of control signals to the axis drives 16, 17, 18. The axis drives 16, 17, 18 receive the control signals and move continuously according to the instructions contained in the control signals until the next update.

As a mathematical example, if the servo cycle time of the servo control is one msec, then the axis positions of the axis drives 16, 17, 18 relative to the X, Y, Z motion axes 21, 22, 23 are measured and a new direction commanded by the computer 24 through the motion controller 32 at a rate of 1000 times per second (i.e., 1 kHz). Shorter servo cycle times provide tighter control over the axis positions of the axis drives 16, 17, 18.

The correction based upon servo cycle time compensates in the intrinsic delay in ejecting one of the amounts 48 from the jetting dispenser 60 after the droplet generator 12 is triggered. The correction is determined from a known time required to prefire the droplet generator 12 so that the amount 48 lands at an appropriate dispense location as one of the fluid material dots 50 on substrate 20 and a known fixed time for each servo cycle. The number of servo cycles is determined from the quotient of the known prefire time divided by the known and fixed servo cycle time.

For example, one of the amounts 48 is to be ejected at a dispense location with (x, y, z) coordinates relative to motion axes 21, 22, 23 specified by an absolute number of servo cycles for each of the axis drives 16, 17, 18. The prefire time of the jetting dispenser 60 is assumed to be equal to 2.5 msec and the number of servo cycles per unit time (i.e., servo cycle rate) is assumed equal to 10 servo cycles per msec. Based upon these assumptions, the triggering or prefire command in servo cycles for prefiring the jetting dispenser 60 is calculated by the computer 24 and communicated to the droplet generator 12. The triggering command is equal to the product of the prefire time and the number of servo cycles per unit time subtracted from absolute number of servo cycles determining the dispense location. In this instance, the triggering command is numerically equal to the product of 2.5 msec and 10 servo cycles per msec, which equals twenty-five (25) servo cycles, subtracted from each coordinate for the dispense location.

Alternatively, a timer can be used in conjunction with the servo cycle to improve the timing resolution by specifying a correction factor in terms of partial servo cycles. As a mathematical example, if the prefire time is equal to 3.5 ms and the servo cycle rate is equal to 1.0 ms, the algorithm would start a 0.5 ms timer at 4.0 ms prior to the trajectory of the jetting dispenser 60 reaching the dispense location. When the timer is used, the time can be a portion of a servo cycle.

In block 186, the computer 24 causes the droplet generator controller 84 to operate the droplet generator 12 to dispense the amounts 48 of fluid material onto the substrate 20 at each dispense location in the pattern. A correction equivalent to the triggering command is applied at each dispense location to prefire the droplet generator 12. The triggering commands, each of which is measured in a number of servo cycles for the axis drives 16, 17, 18, compensate for the time lag or delay between when the instant that the computer 24 communicates a command signal to the droplet generator 12 containing an instruction to initiate the ejection of one of the amounts 48 and the instant in time at which the amount 48 is actually ejected from the jetting dispenser 60.

Continuous motion eliminates vibration observed in conventional motion schemes that accelerate and decelerate the droplet generator 12 as the droplet generator 12 is moved among the dispense locations in the pattern. Using a spline, or similar technique, mathematically guarantees the droplet generator 12 will move through each dispense location. The method of pretriggering the droplet generator 12 eliminates complex mathematics required conventionally to determine the location for prefiring or triggering the droplet generator 12.

References herein to terms such as "vertical", "horizontal", etc. are made by way of example, and not by way of limitation, to establish an absolute frame of reference. In particular, the Cartesian coordinate frame established by the X, Y and Z motion axes 21, 22, and 23 defined herein is exemplary and used for convenience of description. It is understood by persons of ordinary skill in the art that various other frames of reference may be equivalently employed for purposes of describing the present invention.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of Applicants' general inventive concept.

What is claimed is:

1. A method of operating a dispenser within a jetting system to dispense droplets of a fluid material at discrete dispense locations provided at electronic components on a substrate, the method comprising:
   moving the dispenser through each of the discrete dispense locations without dispensing the fluid material;
   analyzing the discrete dispense locations of the dispenser to determine a spatial error corresponding to at least one of the discrete dispense locations;
   creating a corrected map of the discrete dispense locations based defining a continuous motion path based on the spatial error;
   moving the substrate to a fixed position in the jetting system;
   continuously moving the dispenser along the discrete dispense locations of the continuous motion path, without stopping the motion of the dispenser between the electronic components and while changing a direction of the continuous movement while moving along the continuous motion path; and
   depositing the droplets of the fluid material from the dispenser at each of the discrete dispense locations of the continuous motion path on the substrate as the dispenser continuously moves along the continuous motion path without stopping between the electronic components, wherein prior to arriving at each discrete dispense location of the continuous motion path, a control signal is provided to the dispenser to initiate dispensing of each droplet.

2. The method of claim 1, wherein moving the dispenser through the discrete dispense locations is performed on a test substrate, the method further comprising:
   recording an actual position of the dispenser at each of the discrete dispense locations as a function of time, and
   wherein the analyzing is based on the actual position of the dispenser at each of the discrete dispense locations to create the corrected map.

3. The method of claim 2, wherein the actual position is recorded using encoders on a plurality of axis drives moving the dispenser.

4. The method of claim 1, wherein the corrected map minimizes a total travel distance of the dispenser.

5. The method of claim 1, further comprising:
   creating the corrected map through all of the discrete dispense locations based on a mathematical method.

6. The method of claim 5, wherein the mathematical method includes an algorithm that involves a cubic spline technique to calculate the continuous motion path.

7. The method of claim 1, wherein continuously moving the dispenser along the continuous motion path includes changing a direction of the continuous movement, the method further comprising:
   updating the direction at a rate given by a servo cycle.

8. The method of claim 7, wherein the control signal is provided to the dispenser to initiate dispensing of each droplet when the dispenser is at a given number of servo cycles in advance of reaching each discrete dispense location, and further comprising:
   calculating the given number of servo cycles; and
   communicating the given number of servo cycles to the dispenser as the control signal.

9. The method of claim 1, further comprising:
   storing coordinates of all of the discrete dispense locations in a dispense location map and using the coordinates to create the continuous motion path through all of the discrete dispense locations,
   wherein the continuous motion path includes at least one directional change and at least one nonlinear path segment.

10. The method of claim 1, wherein the corrected map compensates for the spatial error in the discrete dispense locations.

11. The method of claim 1, wherein depositing the droplets of the fluid material from the dispenser at each of the discrete dispense locations includes depositing a line of the fluid material at one or more of the electronic components.

12. The method of claim 1, wherein depositing the droplets of the fluid material includes depositing underfill material.

* * * * *